United States Patent
Chuang

(10) Patent No.: US 6,243,267 B1
(45) Date of Patent: Jun. 5, 2001

(54) PGA SOCKET WITH A HEAT SINK FASTENING DEVICE

(75) Inventor: Ching-An Chuang, San-Chi (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/450,843

(22) Filed: Nov. 29, 1999

(30) Foreign Application Priority Data

Sep. 3, 1999 (TW) .................................. 88215107

(51) Int. Cl.[7] .................................. H05U 7/20
(52) U.S. Cl. .................. 361/704; 361/707; 361/717; 361/722; 257/713; 174/16.3; 165/185; 439/342
(58) Field of Search ................. 361/702–707, 361/709–711, 717–719, 722, 818; 257/719–727, 707, 713, 706; 165/880.3, 80.4, 185; 174/16.3; 24/457, 456, 295; 439/459, 342, 261–265, 267; 248/505, 510; 267/150, 160

(56) References Cited

U.S. PATENT DOCUMENTS

| | | | |
|---|---|---|---|
| 5,167,515 | * 12/1992 | Matsuoka et al. | 439/108 |
| 5,256,080 | * 10/1993 | Bright | 439/342 |
| 5,443,591 | * 8/1995 | Tsai | 439/342 |
| 5,883,483 | * 11/1998 | Lai et al. | 439/342 |

* cited by examiner

Primary Examiner—Leo P. Picard
Assistant Examiner—Michael Datskovsky
(74) Attorney, Agent, or Firm—Wei Te Chung

(57) ABSTRACT

A PGA socket comprises a base, a cover slidably attached to the base, a lever and a slider. The lever is rotatablely coupled between the base and the cover to cammingly slide the cover and the slider relative to the base. A CPU having a plurality of terminals is inserted into the PGA socket. A heat sink is then attached to a top of the CPU. When the lever is rotated to a closed position, the cover slides to a closed position, electrically connecting the terminals of the CPU with the contacts in the socket. A pair of latch arms integral with the lever rotate from their open vertical position down between the fins of the heat sink to their closed horizontal position, and at the same time the cams of the lever actuate the slider to cammingly slide toward the heat sink thereby, effectively locking the heat sink into place.

20 Claims, 6 Drawing Sheets

PGA SOCKET WITH A HEAT SINK FASTENING DEVICE

BACKGROUND OF THE INVENTION

The present invention generally relates to a PGA (Pin Grid Array) socket, and particularly to a PGA socket having a fastening device for fixing a heat sink thereto.

A PGA socket is used for connecting an integrated circuit chip to a mother board. Low Insertion Force (LIF) PGA sockets are now in use which reduce the insertion force required to establish an electrical interface between contacts of the PGA socket and terminals of the integrated circuit chip. A typical LIF PGA socket includes a base and a cover slidably attached to the base. The base defines a plurality of passageways and has a corresponding number of contacts retained in the passageways. The cover defines a plurality of holes therethrough in alignment with the passageways. A plurality of terminals of the integrated circuit chip extends through the holes of the cover into the passageways. A lever is assembled to a rear portion of the base and is adapted to cammingly push the cover relative to the base thereby forcing the terminals of the IC chip into electrical contact with the contacts of the base.

A heat sink is usually attachable to the PGA socket for dissipating heat generated by a working integrated circuit chip. A variety of methods and devices are used to fasten the heat sink to the IC chip and the PGA socket, such as those disclosed in U.S. Pat. Nos. 5,600,540 and 5,602,719. Referring to FIG. 5, a conventional clip 1 for closely attaching a heat sink 7 to an integrated circuit chip 12 assembled to a PGA socket 13 includes a pressing beam 2, a first latch arm 4 formed at one end of the pressing beam 2 and a second latch arm 6 formed at an opposite end of the pressing beam 2. While the first latch arm 4 securely engages with a first protrusion 14 formed at one lateral end of the socket 13 and the second latch arm 6 securely engages with a second protrusion (not shown) formed at an opposite lateral end of the socket 13, the pressing beam 2 extends across the heat sink 7 and downward presses against the heat sink 7. FIG. 6 shows a second conventional clip 18 for closely attaching a heat sink 22 to an integrated circuit chip 23 on a PGA socket 24.

The first conventional clip 1 is a separate element from the PGA socket 13. After the integrated circuit chip 12 is attached to the socket 13 and the heat sink 7 is then attached to the integrated circuit chip 12, the clip 1 is assembled to press the heat sink 7 toward the integrated circuit chip 12. Since room for operating the clip 1 is limited, a tool is usually needed to assemble or disassemble the clip 1. The small operating room may hinder efficient assembly of the clip 1 to the socket 13. In addition, the inconvenient process of assembling the clip 1 to the socket 13 may collide with and damage the heat sink 7 or even a mother board on which the PGA socket 13 is mounted. Therefore, a combination of an LIF PGA socket and a heat sink clip which can solve the above-mentioned problems is desired.

SUMMARY OF THE INVENTION

A main purpose of the present invention is to provide a PGA socket having a heat sink fastening device with a simple structure for fixing a heat sink to an integrated circuit chip in the socket.

To fulfill the above-mentioned purposes, a PGA socket comprises a base, a cover slidably attached to the base, a lever and a slider. The base defines a plurality of passageways for retaining a corresponding number of contacts. The cover defines a plurality of holes in alignment with the passageways. The lever is rotatablely coupled between the base and the cover for cammingly sliding the cover and the slider relative to the base. The lever includes a pair of latch arms for downwardly pressing a heat sink against a CPU mounted in the socket when the lever is in a closed position, thereby attaching the heat sink in intimate thermal contact with the CPU. The lever also includes a pair of cams to cammingly push the slider, thereby fixingly engaging a lateral edge of the heat sink when in a closed position.

DETAILED DESCRIPTION OF THE PREFERRED EMBODIMENT

Figure 1:
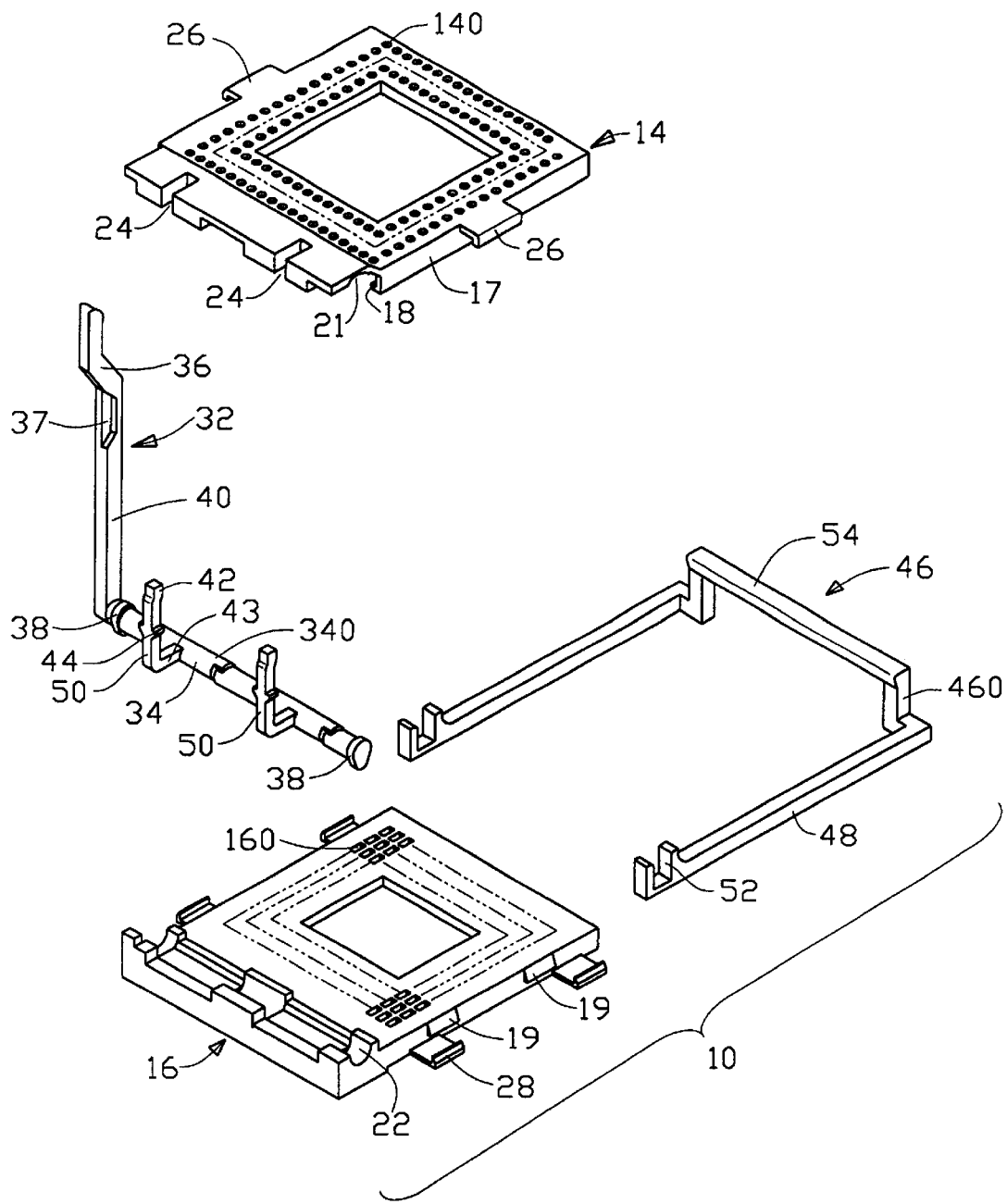
FIG. 1 is an exploded view of a PGA socket in accordance with the present invention.

Referring to FIG. 1, a LIF PGA socket 10 comprises a base 16, a cover 14, an L-shaped lever 32 and a U-shaped slider 46. The base 16 includes a plurality of passageways 160 in rows and columns and a corresponding number of contacts (not shown) retained in the passageways 160. A lower channel 22 is transversely disposed in a top surface of the base 16 proximate a rear edge of the base 16. A pair of inclined protrusions 19 and a pair of lower restriction plates 28 project at each of two opposite lateral edges of the base 16.

The cover 14 is slidably attached to the base 16 and includes a plurality of holes 140 in alignment with the passageways 160. An upper channel 21 is transversely disposed in a bottom surface of the cover 14 corresponding to the lower channel 22 of the base 16. A pair of slots 24 is defined at a rear edge of the cover 14. A pair of longitudinal extending latch walls 17 each with an inner hook 18 is provided at each of two opposite lateral edges of the cover 14 corresponding to the protrusions 19 of the base 16. An upper restriction plate 26 outwardly extends from each transverse end of the cover 14 in integral connection with the latch wall 17 corresponding to the lower restriction plates 28 of the base 16.

Figure 2:
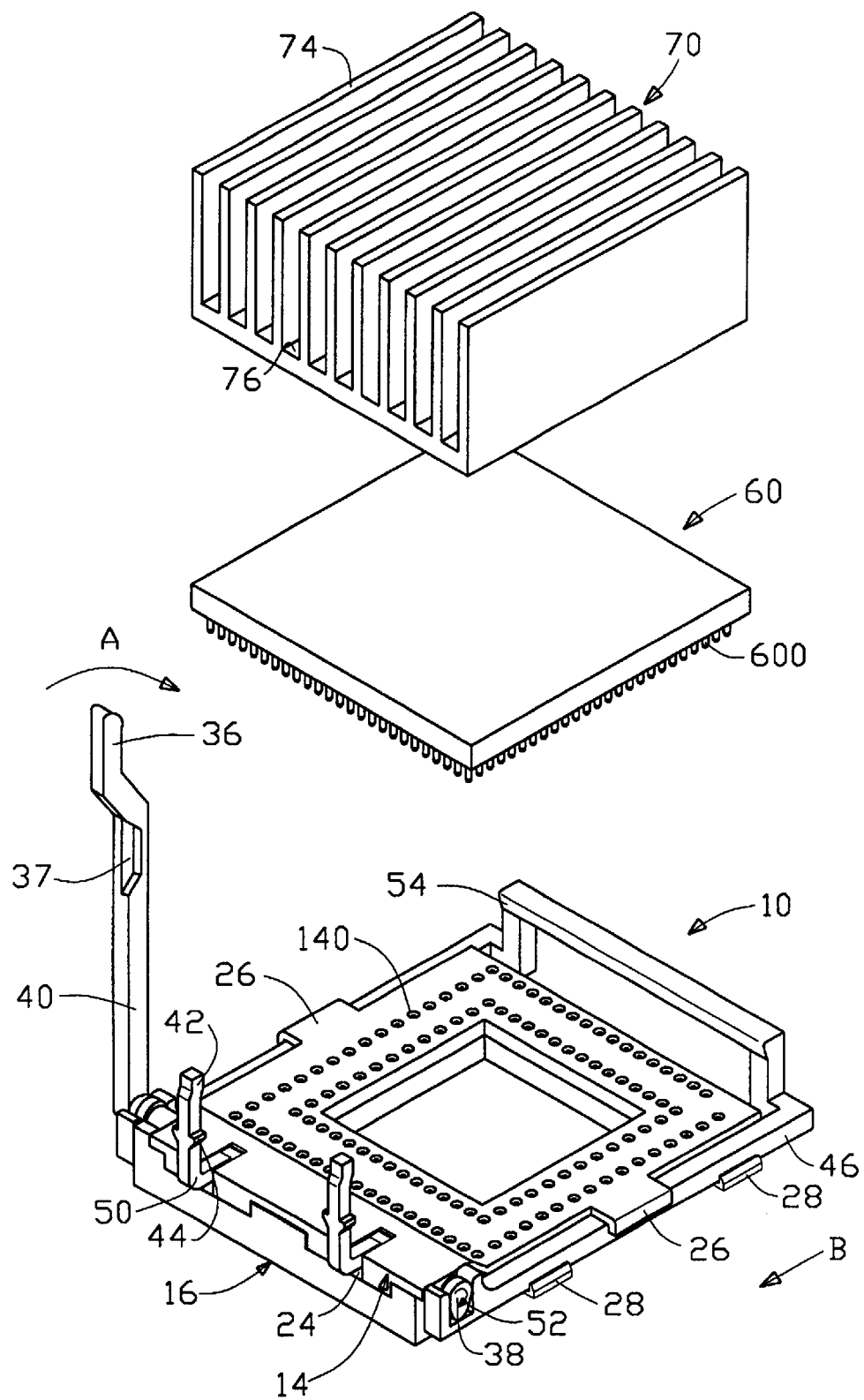
FIG. 2 is an assembled view of the PGA socket of FIG. 1 before a heat sink and a CPU are assembled thereto.

Also referring to FIG. 2, when the cover 14 is attached to the base 16, the upper channel 21 and the lower channel 22 cooperatively define an elongate cavity therebetween to rotatably retain the lever 32. The latch walls 17 of the cover 14 partially cover the transverse ends of the base 16 with the inner hooks 18 engaging with the protrusions 19 to prevent an upward movement of the cover 14 relative to the base 16 while allowing a forward and rearward movement of the cover 14 relative to the base 16. The upper and lower restriction plates 26, 28 cooperatively define lateral limits between which the slider 46 is slidably retained.

The lever 32 includes a handle 40 and a cam shaft 34 perpendicularly extending from a distal end of the handle 40. The cam shaft 34 is rotatably retained by the cooperation of the upper and lower channels 21, 22 of the cover 14 and the base 16, and forms a cam surface 340 for pushing the cover 14 in a direction "C" (FIG. 3) relative to the base 16. A pair of L-shaped latch arms 50 integrally extends from the cam shaft 34. Each latch arm 50 includes a retention beam 43 integrally extending from the cam shaft 34 substantially in a direction perpendicular to both the cam shaft 34 and the handle 40, and a pressing beam 42 perpendicularly extending from a distal end of the retention beam 43 substantially in a direction parallel to the handle 40. The slots 24 of the cover 14 provide room to allow rotatable movement of the retention beams 43 with the cam shaft 34. A pair of wings 44 is symmetrically formed at opposite sides of the pressing beam 42. An arcurate surface is formed on the pressing beam 42 proximate a distal end of the pressing beam 42. A pair of cams 38 is generally formed at opposite ends of the cam shaft 34 and is exposed outside of the upper and lower channels 21, 22. An actuation portion 36 is formed proximate a distal end of the handle 40. A notch 37 is defined proximate the actuation portion 36.

The slider 46 includes a middle rod 54, a pair of standoff rods 460 downwardly extending from the opposite ends of the middle rod 54, and a pair of parallel sliding rods 48 perpendicularly extending from the standoff rods 460. A U-shaped recess 52 is defined proximate a distal end of each sliding rod 48 and is dimensioned to allow the cam 38 to act therein. The middle rod 54 forms an arcurate surface projecting toward the distal end of the sliding rod 48.

The sliding rods 48 are slidably retained in the passage cooperatively defined by the upper and lower restriction plates 26, 28. The cams 38 of the lever 32 are retained within the recesses 52 of the slider 46 and are adapted to cammingly push the slider 46 in directions "B" (FIG. 2).

Figure 3:
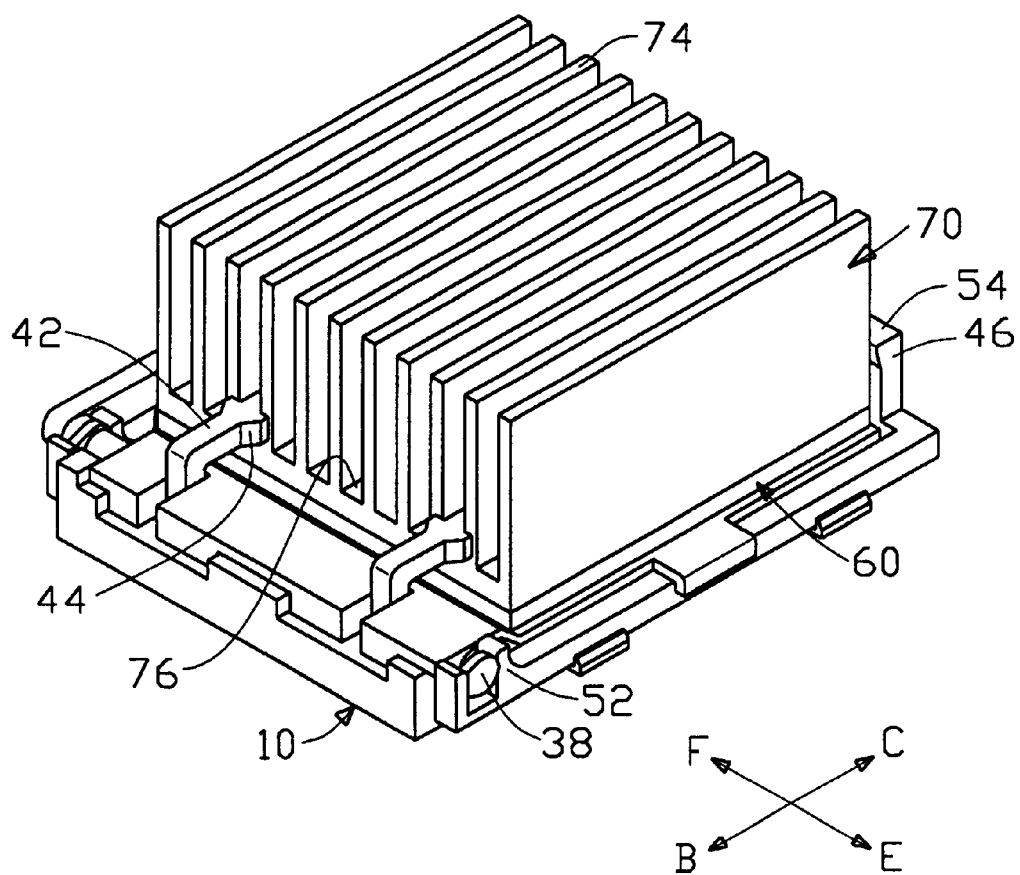
FIG. 3 is an assembled view of FIG. 2.

Also referring to FIGS. 2 and 3, a CPU 60 includes a plurality of terminals 600 extending from a bottom surface thereof and is placed in the PGA socket 10 with the terminals 600 inserted into the holes 140 of the cover 14 and in contact with the contacts in the base 16. A heat sink 70 includes a plurality of fins 74 with a plurality of grooves 76 defined therebetween. A bottom surface of the heat sink 70 is placed against a top surface of the CPU 60.

A force is applied to the actuation portion 36 of the handle 40 in a direction "A" (FIG. 2) to rotate the cam shaft 34. The camming surface 340 of the cam shaft 34 pushes the cover 14 to move in a direction "C" relative to the base 16. The pressing beams 42 of the latch arms 50 are rotatably received in the grooves 76 of the heat sink 70 to prevent a movement of the heat sink in directions "E" and "F" (FIG. 3) relative to the PGA socket 10. The wings 44 of the latch arms 50 abut against edges of the fins 74 to prevent a movement of the heat sink 70 in a direction "B" relative to the PGA socket 10. The cams 38 of the lever 32 are rotated to cammingly push the inner side of the recess 52 of the slider 46 to move the slider 46 in a direction "B" relative to the PGA socket 10. Accordingly, the middle rod 54 of the slider 46 is moved to abut against the heat sink 70 in a direction "B" to prevent a movement of the heat sink in a direction "C" relative to the PGA socket 10. Thus, movement of the heat sink 74 along any axis relative to the PGA socket 10 is effectively blocked. The heat sink 70 is reliably fixed in place. The notch 37 of the lever 32 is locked by a corresponding structure formed on the PGA socket which is commonly known in the art.

It should be noted that the lever 32 and the slider 46 for retaining the heat sink are integral parts of the PGA socket 10. The separate components and complicated assembly process normally used in the industry to fix the heat sink to the socket are not needed. All the movements of the lever 32 and the slider 46 are actuated by a force exerted on the actuation portion 36 of the lever 32; no additional tools are needed to assemble or disassemble the heat sink, and the process of assembling the heat sink to the socket is therefore simplified.

Figure 4:
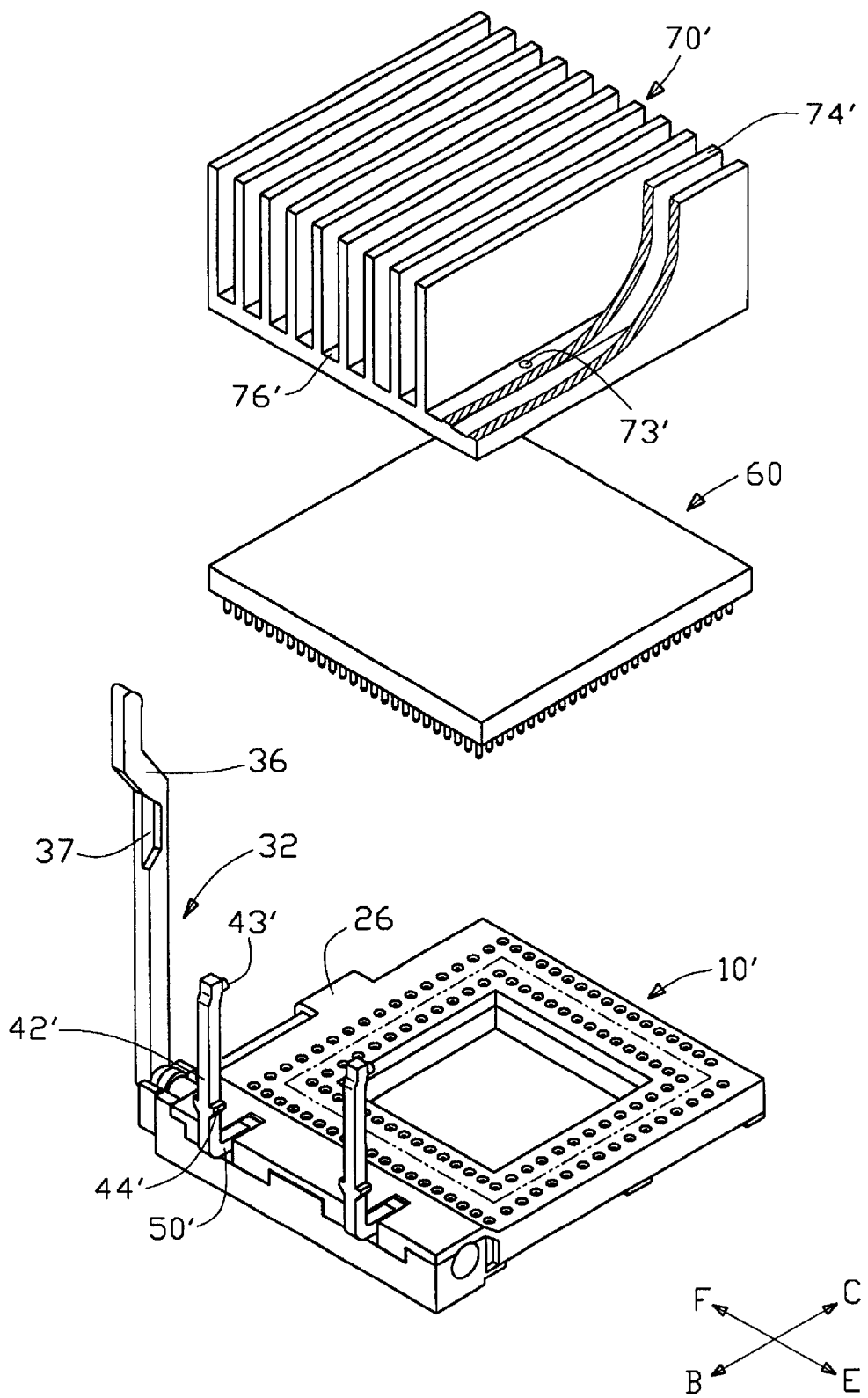
FIG. 4 is a perspective view of a PGA socket of an alternative embodiment before a heat sink and a CPU are assembled thereto.
Figure 5:
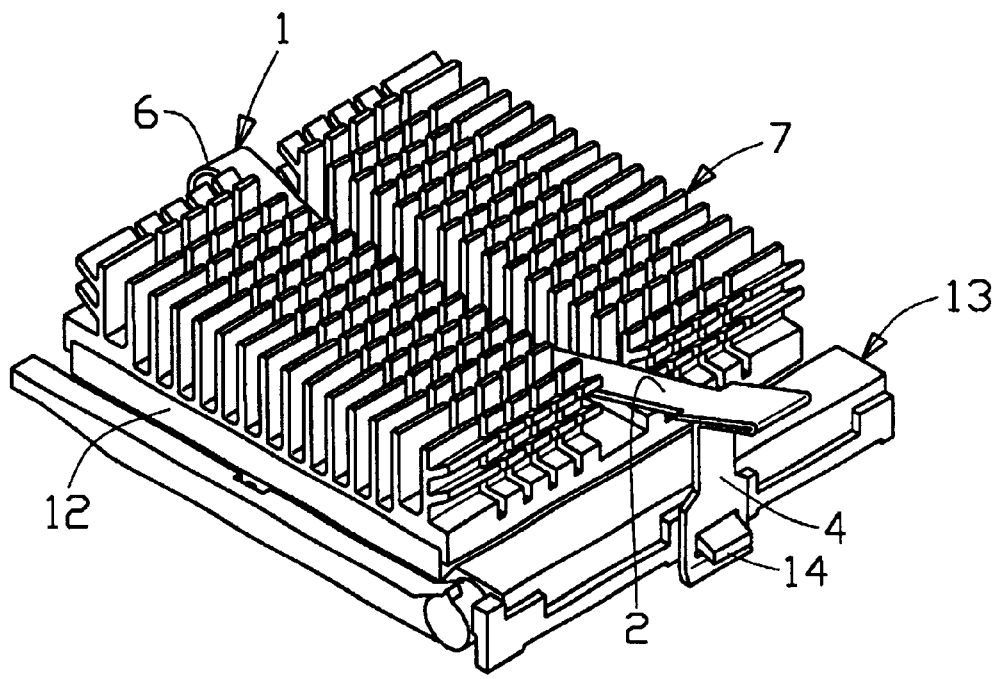
FIG. 5 is a perspective view of a first conventional PGA socket and a CPU with a heat sink fixed thereto by a clip.
Figure 6:
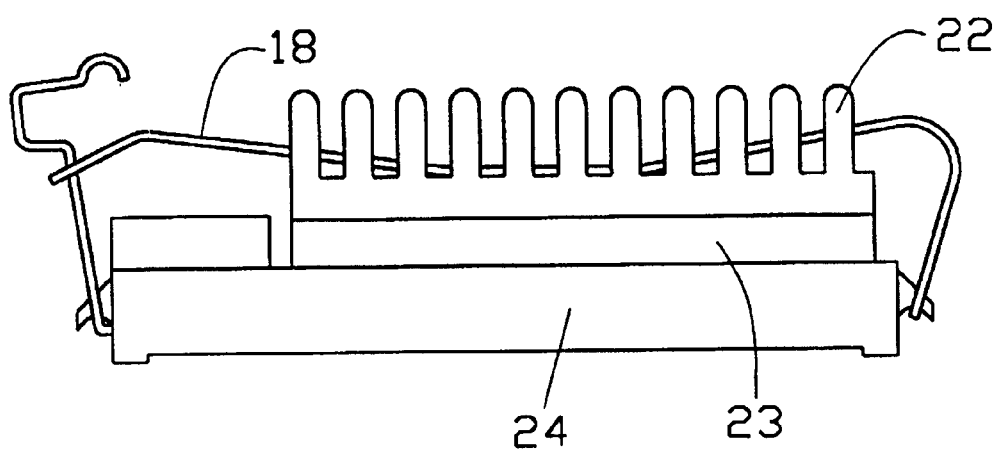
FIG. 6 is a side view of a second conventional PGA socket and a CPU with a heat sink fixed thereto by a clip.

FIG. 4 shows a PGA socket 10' of an alternative embodiment of the present invention. Unlike the PGA socket 10, the PGA socket 10' does not have a slider 46 and corresponding structures to slidably retain and cammingly push the slider 46. Each pressing beam 42' of the latch arm 50' forms a pin 43' projecting from the arcurate surface thereof. Correspondingly, a pair of apertures 73' is defined in the groove 76' of the heat sink 70'.

A CPU 60 is inserted into the PGA socket 10' and a bottom surface of a heat sink 70' is placed against a top surface of the CPU 60. In a process similar to that discussed above, the pressing beams 42' of the latch arms 50' are rotatably received into the grooves 76' of the heat sink 70' to prevent a movement of the heat sink 70' in the directions "E" and "F" relative to the PGA socket 10'. The wings 44' of the latch arms 50' abut against edges of the fins 74' to prevent a movement of the heat sink 70' in the direction "B" relative to the PGA socket 10'. The pins 43' of the pressing beams 42' are inserted into the apertures 73' of the heat sink 70' and prevent a horizontal movement of the heat sink 70' relative to the PGA socket 10'. Thus, all possible movement of the heat sink 70' relative to the PGA socket 10' is effectively blocked. The heat sink 70' is reliably fixed. It should be noted that the structure of the alternative embodiment is much simplified.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket assembly for receiving a CPU and a heat sink placed upon the CPU, the socket assembly comprising:
   a base including a plurality of passageways defined therethrough and a corresponding number of contacts accommodated in the passageways;
   a cover being slidably engaged with the base and defining a plurality of holes therethrough in alignment with the passageways; and
   a lever including a handle for manual manipulation and a cam shaft joined to the handle, the cam shaft being rotatably disposed between the base and the cover for cammingly engaging with the cover to slide the cover horizontally relative to the base, a latch arm projecting from the cam shaft and being rotatable together with the cam shaft by the handle to downwardly press a heat sink against a CPU.

2. The socket assembly as claimed in claim 1, further comprising a slider including a middle rod and a pair of sliding rods integrally extending from opposite ends of the middle rod, the sliding rods each slidably retained at transverse ends of the socket and each defining a recess proximate a distal end thereof, a pair of cams formed at opposite ends of the cam shaft each being pivotably received in a corresponding recess of the slider to cam against the slider in a predetermined direction such that the middle rod supportingly abuts against a lateral end of the heat sink.

3. The socket assembly as claimed in claim 2, wherein the cover includes an upper restriction plate at opposite sides of the cover and the base includes a lower restriction plate at opposite sides of the base, the upper and lower restriction plates cooperatively defining a passage on each side of the socket for slidably retaining the sliding rods of the slider.

4. The socket assembly as claimed in claim 1, wherein the latch arm includes a retention beam integrally extending from the cam shaft and a pressing beam extending from a distal end of the retention beam at an angle to the retention beam.

5. The socket assembly as claimed in claim 4, wherein a pair of wings is formed on opposite sides of the pressing beam of the lever to abut against a lateral edge of the heat sink.

6. The socket assembly as claimed in claim 4, wherein a pin projects from the pressing beam proximate a distal end thereof and is adapted to engage with a corresponding aperture defined in a groove of the heat sink.

7. The socket assembly as claimed in claim 1, wherein an upper channel is defined in a bottom surface of the cover proximate a rear portion thereof and a lower channel is defined in a top surface of the base proximate a rear portion thereof, the upper and lower channels cooperatively defining a cavity to rotatably retain the cam shaft of lever.

8. The socket assembly as claimed in claim 1, wherein a pair of latch walls is formed on opposite transverse ends of the cover and a pair of protrusions is formed on each transverse end of the base, the latch walls slidably engaging with the protrusions.

9. An electrical system comprising:
   a socket connector including:
      a base including a plurality of passageways defined therethrough and a corresponding number of contacts received in the passageways; and
      a cover being slidably engaged with the base and defining a plurality of holes therethrough in alignment with the passageways;
   an electronic element electrically disposed upon the socket connector;
   a heat sink disposed upon the electronic element, the heat sink including
      a plurality of fins and a plurality of grooves defined between the fins; and
   a retention mechanism including:
      a lever including a cam shaft and a handle joined to the cam shaft, the cam shaft being rotatably disposed between the base and the cover of the socket connector for camming against the cover to slide the cover relative to the base when the handle is manually manipulated, a latch arm projecting from the cam shaft and being rotatable together with the cam shaft to press the heat sink against the electronic element and the socket connector; and
      a slider movably disposed between the base and the cover of the socket connector for cooperating with the lever to retain the heat sink on the electronic element and the socket connector.

10. The electrical system as claimed in claim 9, wherein the slider includes a middle rod and a pair of sliding rods integrally extending from opposite ends of the middle rod, the sliding rods slidably retained at transverse ends of the socket and each defining a recess proximate a distal end thereof, and a pair of cams being formed at opposite ends of the cam shaft and pivotably received in the recesses to cam against the slider in a predetermined direction such that the middle rod supportingly abuts against a lateral end of the heat sink.

11. The electrical system as claimed in claim 10, wherein the cover includes an upper restriction plate at opposite sides of the cover and the base includes a lower restriction plate at opposite sides of the base, the upper and lower restriction plates cooperatively defining a passage on each side of the socket for slidably retaining the sliding rods of the slider.

12. The electrical system as claimed in claim 9, wherein the latch arm includes a retention beam integrally extending from the cam shaft and a pressing beam extending from a distal end of the retention beam at an angle to the retention beam.

13. The electrical system as claimed in claim 12, wherein a pair of wings is formed on opposite sides of the pressing beam of the lever to abut against a lateral edge of the heat sink.

14. The electrical system as claimed in claim 12, wherein a pin projects from the pressing beam proximate a distal end thereof and is adapted to engage with a corresponding aperture defined in a groove of the heat sink.

15. The electrical system as claimed in claim 9, wherein an upper channel is defined at a bottom surface of the cover proximate a rear portion thereof and a lower channel is defined at a top surface of the base proximate a rear portion thereof, the upper and lower channels cooperatively defining a cavity to rotatably retain the cam shaft of lever.

16. The electrical system as claimed in claim 9, wherein a pair of latch walls is formed at opposite transverse ends of the cover and a pair of protrusions is formed on each transverse end of the base, the latch walls slidably engaging with the protrusions.

17. An electrical system comprising:
   a socket connector including:
      a base defining a plurality of passageways extending therethrough, a plurality of contacts received within the corresponding passageways, respectively;
      a cover slidably mounted on the base and defining a plurality of holes extending therethrough in alignment with the corresponding passageways, respectively;
      a lever positioned in the socket connector and including a cam shaft and a handle joined to the cam shaft, said cam shaft actuating the cover to slidably move with regard to the base by rotating the handle;
   an electronic element seated on the cover and electrically connected to the corresponding contacts;
   a heat sink positioned on the electronic element; and
   the socket connector further including means for engagement with the heat sink; wherein
   said means is actuated to move by rotating the handle.

18. The system as claimed in claim 17, wherein said means includes at least a latch arm extending from the cam shaft and rotatably moved along with the cam shaft.

19. The system as claimed in claim 17, wherein said means includes a slider having a pivotal relation with the cam shaft and horizontally moved with regard to the base of the socket when the cam shaft is rotated.

20. A socket connector assembly comprising:
   a base defining a plurality of passageways extending therethrough, a plurality of contacts received within the corresponding passageways, respectively;
   a cover mounted on the base and being horizontally slidable with regard to the base, said cover defining a plurality of holes extending therethrough in alignment with the corresponding passageways, respectively;
   a lever positioned in the socket connector and including a cam shaft and a handle joined to the cam shaft, said cam shaft actuating the cover to slidably move with regard to the base by rotating the handle; and a slider retained to the socket connector and actuated to move horizontally with regard to the base by rotating the handle; wherein said slider and said cover move in opposite directions toward each other when the handle is rotated from a vertical open position to a horizontal locking position.

* * * * *